(12) United States Patent
Wen et al.

(10) Patent No.: US 11,874,988 B2
(45) Date of Patent: Jan. 16, 2024

(54) BONDING CIRCUIT BOARD, DISPLAY APPARATUS AND ELECTRICAL APPLIANCE

(71) Applicants: Chengdu BOE Optoelectronics Technology Co., Ltd., Sichuan (CN); BOE TECHNOLOGY GROUP CO., LTD., Beijing (CN)

(72) Inventors: Hui Wen, Beijing (CN); Lianbin Liu, Beijing (CN); Xu Lu, Beijing (CN); Hengzhen Liang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/636,098

(22) PCT Filed: Mar. 10, 2021

(86) PCT No.: PCT/CN2021/079926
§ 371 (c)(1),
(2) Date: Feb. 17, 2022

(87) PCT Pub. No.: WO2021/218419
PCT Pub. Date: Nov. 4, 2021

(65) Prior Publication Data
US 2022/0291799 A1  Sep. 15, 2022

(30) Foreign Application Priority Data
Apr. 30, 2020 (CN) .......................... 202010367594.5

(51) Int. Cl.
*G06F 3/041* (2006.01)
*H05K 1/18* (2006.01)

(52) U.S. Cl.
CPC ........ *G06F 3/04164* (2019.05); *G06F 3/0412* (2013.01); *H05K 1/18* (2013.01);
(Continued)

(58) Field of Classification Search
None
See application file for complete search history.

(56) References Cited

U.S. PATENT DOCUMENTS

2015/0022741 A1* 1/2015 Nii .......................... H05K 1/189
349/12
2015/0092120 A1 4/2015 Wang et al.
(Continued)

FOREIGN PATENT DOCUMENTS

CN 108008584 A 5/2018
CN 108877528 A 11/2018
(Continued)

*Primary Examiner* — Brian M Butcher
(74) *Attorney, Agent, or Firm* — HOUTTEMAN LAW LLC

(57) ABSTRACT

Embodiments of the present disclosure provide a bonding circuit board, one end of which is connected to a display panel, and the other end of which is connected to a host side; the bonding circuit board includes a first sub-section and a second sub-section, which may be bonded and connected to each other, the first sub-section includes at least three first printed circuit layers, which are stacked on one another, and an insulation layer is arranged between any two adjacent first printed circuit layers of the at least three first printed circuit layers; and the second sub-section includes one second printed circuit layer or two second printed circuit layers which are stacked on each other, and the insulation layer is arranged between the two second printed circuit layers.

15 Claims, 4 Drawing Sheets

(52) U.S. Cl.
CPC ............... *H05K 2201/0364* (2013.01); *H05K 2201/10128* (2013.01)

(56) References Cited

U.S. PATENT DOCUMENTS

2019/0259818 A1* 8/2019 Jeon .................... H10K 50/844
2019/0380197 A1* 12/2019 Lee ..................... H05K 5/0026

FOREIGN PATENT DOCUMENTS

| | | |
|---|---|---|
| CN | 110286535 A | 9/2019 |
| CN | 110718577 A | 1/2020 |
| CN | 211628229 U | 10/2020 |

\* cited by examiner

BONDING CIRCUIT BOARD, DISPLAY APPARATUS AND ELECTRICAL APPLIANCE

TECHNICAL FIELD

Embodiments of the present disclosure belong to the field of display technology, and in particular, relate to a bonding circuit board, a display apparatus and an electrical appliance.

BACKGROUND

Touch display modules are classified into two types, namely, add-on type (i.e., a touch substrate being attached to a display panel) and FMLOC (Flexible Multi-Layer On Cell) type (i.e., a touch substrate being embedded in a display panel), depending on the manner by which a touch substrate is integrated with a display panel. Since touch display modules of FMLOC type have such advantages as low cost, high flexibility and small stack thickness, there is an increasing trend to choose FMLOC technology to make display modules. The FMLOC technology is to place respective peripheral components of both touch and display on a single peripheral circuit board and then bond the peripheral circuit board to a display panel via a bonding region on the peripheral circuit board.

SUMMARY

Embodiments of the present disclosure provide a bonding circuit board, a display apparatus and an electrical appliance.

In a first aspect, embodiments of the present disclosure provide a bonding circuit board, one end of which is connected to a display panel, and another end of which is connected to a host side; the bonding circuit board includes a first sub-section and a second sub-section, which are bondable and connectable to each other, the first sub-section includes at least three first printed circuit layers, which are staked on one another, and an insulation layer is arranged between any two adjacent first printed circuit layers; and the second sub-section includes one second printed circuit layer, or two second printed circuit layers which are stacked on each other, and the insulation layer is arranged between the two second printed circuit layers.

In some embodiments, the first printed circuit layers include circuit elements and first signal wiring, which are electrically connected to each other and constitute a peripheral circuit of the display panel and the host side.

In some embodiments, the second printed circuit layer includes second signal wiring, which is electrically connected to the first second signal wiring.

In some embodiments, the first signal wiring and the second signal wiring each include power signal lines, data signal lines and control signal lines.

In some embodiments, the circuit elements are located on an outermost first printed circuit layer of the at least three first printed circuit layers.

In some embodiments, the circuit elements include a touch driver chip.

In some embodiments, the first sub-section further includes a first bonding terminal, which is arranged on the outermost first printed circuit layer and is electrically connected to the first signal wiring; the second sub-section further includes a second bonding terminal, which is arranged on the second printed circuit layer and is electrically connected to the second signal wiring; and the first bonding terminal and the second bonding terminal are bondable and connectable to each other.

In some embodiments, the first sub-section further includes a third bonding terminal, which is arranged on the outermost first printed circuit layer; the second sub-section further includes a fourth bonding terminal, which is arranged on the second printed circuit layer; the third bonding terminal is bondable and connectable to the display panel; and the fourth bonding terminal is bondable and connectable to the host side.

In some embodiments, the first bonding terminal and the third bonding terminal are arranged in edge regions of two opposite ends of the first printed circuit layer, respectively; and the second bonding terminal and the fourth bonding terminal are arranged in edge regions of different ends of the second printed circuit layer, respectively.

In some embodiments, a shape of the first sub-section is a regular shape, and a shape of the second sub-section is a regular shape or an irregular shape.

In some embodiments, a shape of an orthographic projection of the first sub-section includes a rectangle, and a shape of an orthographic projection of the second sub-section includes an L shape.

In some embodiments, an insulation layer is further arranged at an outer side of a first printed circuit layer which is on a surface of the at least three first printed circuit layers; and an insulation layer is further arranged at an outer side of the second printed circuit layer.

In a second aspect, embodiments of the present disclosure provide a display apparatus, including a display panel and a host side, and further including the bonding circuit board; and the bonding circuit board is connected to the display panel and the host side by bonding, respectively.

In some embodiments, the display panel includes a display substrate, and a touch substrate, which is formed in the display substrate.

In a third aspect, embodiments of the present disclosure provide an electrical appliance, including the display apparatus.

BRIEF DESCRIPTION OF THE DRAWINGS

Accompanying drawings are provided for further understanding of embodiments of the present disclosure and constitute a part of the specification. These drawings are intended to explain the present disclosure together with the embodiments, but should not be considered as a limitation thereupon. The above and other features and advantages of the present disclosure will become more apparent to a person skilled in the art by describing in detail exemplary embodiments thereof with reference to the accompanying drawings in which.

DETAIL DESCRIPTION OF EMBODIMENTS

Figure 1:
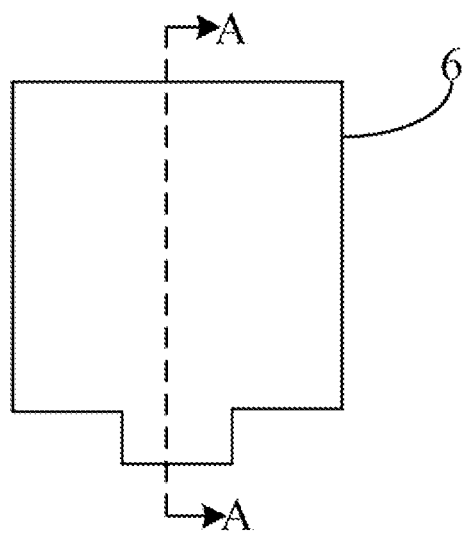
FIG. 1 illustrates a top view of a structure of a peripheral circuit board in the disclosed technology.

To enable a person skilled in the art to better understand the technical solutions of the present disclosure, a detailed description is hereinafter given to the bonding circuit board, the display apparatus and the electrical appliance provided in embodiments of the present disclosure with reference to accompanying drawings and embodiments.

Embodiments of the present disclosure will be described more fully hereinafter with reference to the accompanying drawings. However, embodiments to be described may be presented in many different forms and should not be construed as limited to the embodiments set forth herein. Rather, these embodiments are provided so that the present disclosure will be thorough and complete, and will fully convey the scope of the present disclosure to a person skilled in the art.

Embodiments of the present disclosure are not limited to the embodiments illustrated in the drawings, but include modifications to the configurations formed on the basis of the manufacturing process. Therefore, regions shown in the drawings are illustrative only, and shapes of regions shown in the drawings are only specific examples of the shapes of these regions, but are not intended to be a limitation thereupon.

Figure 2:
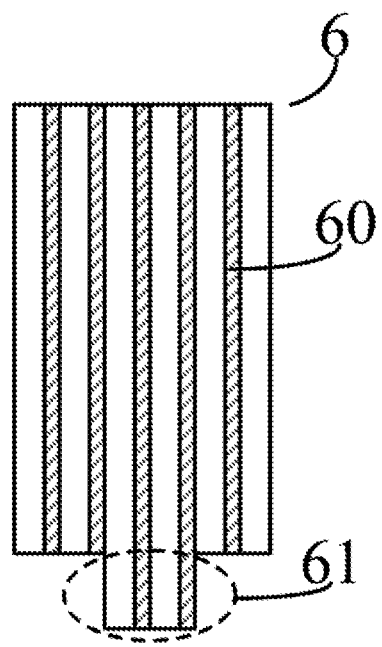
FIG. 2 illustrates a sectional view of the structure of the peripheral circuit board in FIG. 1 taken along line AA.

FIGS. 1 and 2 illustrate a structure of a peripheral circuit board 6 used in an FMLOC (Flexible Multi-Layer On Cell) touch display module (i.e., a touch display module formed by embedding a touch substrate in a display panel) in the disclosed technology. Due to a large amount of wiring in the peripheral circuit board 6 and the need to prevent such problems as crosstalk between touch and display signals, peripheral circuit boards 6 in the FMLOC technology are all designed by using sub-circuit boards 60 in multiple layers. However, as customers' demands for the appearance of touch display modules are becoming increasingly diversified, it is necessary for the peripheral circuit boards 6 to have various irregular shapes to meet the requirement for them to be bonded to and accommodated in the touch display modules, which would reduce the utilization rate of the peripheral circuit boards 6 having the same specification and shape. Meanwhile, the peripheral circuit boards 6 are typically cut from a single piece of circuit board having a multi-layered structure of the sub-circuit boards 60, and as the shapes of the peripheral circuit boards 6 are irregular and different from one another, during the cutting and formation of the peripheral circuit boards 6 in various shapes, a considerable waste of the single piece of circuit board having the multi-layered structure of the sub-circuit boards 60 would be resulted, and accordingly, the utilization rate thereof would be reduced. Moreover, given that material and manufacturing costs of the circuit board having the multi-layered structure of the sub-circuit boards 60 are relatively high, cutting it into the peripheral circuit boards 6 in various shapes would make material and manufacturing costs of the peripheral circuit boards 6 even higher.

Furthermore, one end of the peripheral circuit board 6 is bonded to the display panel, and another end thereof is bonded to a host side that provides power and control signals to the display panel. In order to make it easy to bond and connect the peripheral circuit board 6 to the host side, a portion of the peripheral circuit board 6 is configured as a double-layered board 61 (i.e., a double-layered sub-circuit board). The double-layered board 61 is obtained by cutting the circuit board having the multi-layered structure of the sub-circuit boards 60, which not only makes the manufacturing process difficult but also raises the costs.

To address the problem of the low utilization rate of the peripheral circuit board adopting the multi-layered structure, embodiments of the present disclosure provide a bonding circuit board, a display apparatus and an electrical appliance.

Figure 3:
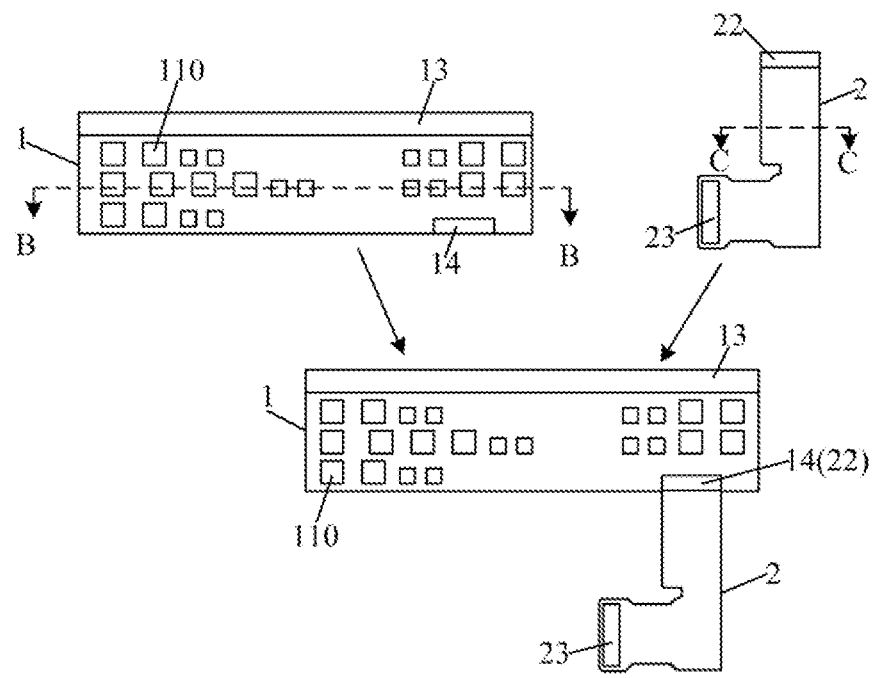
FIG. 3 illustrates top views of respective structures of a first sub-section and a second sub-section of a bonding circuit board as well as a structure formed by bonding the first sub-section with the second sub-section, according to some embodiments of the present disclosure.
Figure 4:
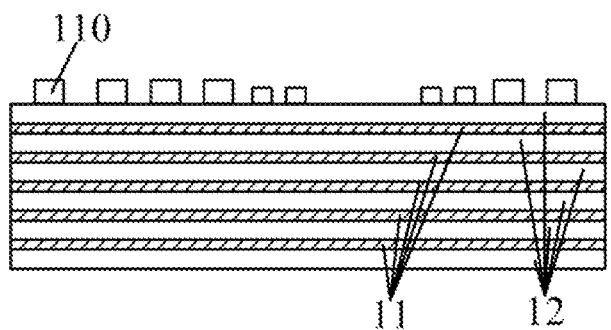
FIG. 4 illustrates a sectional view of the structure of the first sub-section in FIG. 3 taken along line BB.
Figure 5:
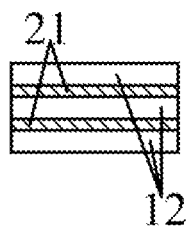
FIG. 5 illustrates a sectional view of the structure of the second sub-section in FIG. 3 taken along line CC.

In a first aspect, some embodiments of the present disclosure provide a bonding circuit board. As illustrated in FIGS. 3 to 5, one end of the bonding circuit board is connected to a display panel, and another end thereof is connected to a host side; the bonding circuit board includes a first sub-section 1 and a second sub-section 2, the first sub-section 1 and the second sub-section 2 may be bonded and connected to each other, the first sub-section 1 includes at least three first printed circuit layers 11, which are stacked on one another, and an insulation layer 12 is arranged between any two adjacent first printed circuit layers 11; and the second sub-section 2 includes two second printed circuit layers 21, which are stacked on each other, and the insulation layer 12 is arranged between the second printed circuit layers 21.

The host side provides power and control signals (e.g., clock signal, enable signal, etc.) to the display panel, and it mainly includes a power supply, a CPU (i.e., a central processing unit which acts as a computation and control core in a computer system and is the ultimate execution unit for processing information and running programs), etc.

Since the bonding circuit board is configured to include the first sub-section 1 formed by stacking at least three first printed circuit layers 11 and the second sub-section 2 formed by stacking two second printed circuit layers 21, due to its relatively low material and manufacturing costs, the second sub-section 2 formed by staking the two second printed circuit layers 21 can be cut into any irregular shape to meet the requirement for the bonding circuit board to have an irregular shape, and on the other hand, due to its relatively high material and manufacturing costs, the first sub-section 11 formed by stacking the at least three first printed circuit layers 11 can be cut into a regular shape, thereby increasing the utilization rate of a circuit board having a stacked structure of multiple first printed circuit layers 11, from which the first sub-section 1 is cut, and reducing the material and manufacturing costs of the bonding circuit board. Meanwhile, since a thickness of the second sub-section 2 is small, the bonding circuit board, which is formed by bonding and connecting the first sub-section 1 and the second sub-section 2, can be made flexible, so that the bonding circuit board can meet the requirement for it to be bonded to and accommodated in a display module in any shape, thereby increasing the utilization rate of the bonding circuit board.

In some embodiments, the first printed circuit layers 11 include circuit elements 110 and first signal wiring, which are electrically connected to each other and constitute a peripheral circuit of the display panel as well as the host side. Since the first sub-section 1 is formed by stacking the insulation layers 12 and at least three first printed circuit layers 11, it has a strong rigidity, and can well support and secure the circuit elements 110 which are arranged on it; and therefore, the circuit elements 110 can be prevented from being damaged due to loose securing.

The circuit elements 110 include components such as resistors, capacitors, transistors and the like. In some embodiments, the circuit elements 110 further include a touch driver chip. Arranging the touch driver chip on the bonding circuit board can prevent the touch driver chip from unnecessarily occupying a touch area or a frame area of a touch substrate, thereby enlarging the touch area of the touch substrate and reducing a width of a frame thereof.

In some embodiments, the circuit elements 110 are situated on an outermost first printed circuit layer 11. Alternatively, the circuit elements 110 may be situated on any other printed circuit layer 11 sandwiched between two outermost first printed circuit layers 11, in accordance with circuit design requirements.

In some embodiments, the second printed circuit layers 21 include second signal wiring, which is electrically connected to the first signal wiring.

The first signal wiring and the second signal wiring each include power signal lines, data signal lines and control signal lines. The control signal lines include an enable signal line, a clock signal line and the like. The first signal wiring and the second signal wiring can implement the functions of enabling the host side to provide power, data and control signals to the display panel, and the like.

In some embodiments, the first sub-section 1 further includes a first bonding terminal 14, which is arranged on the outermost first printed circuit layer 11 and is electrically connected to the first signal wiring; the second sub-section 2 further includes a second bonding terminal 22, which is arranged on a second printed circuit layer 21 and is electrically connected to the second signal wiring; and the first bonding terminal 14 and the second bonding terminal 22 may be bonded and connected to each other. The first signal wiring and the second wring may be electrically connected to each other by bonding and connecting the first bonding terminal 14 and the second bonding terminal 22.

In some embodiments, the first sub-section 1 further includes a third bonding terminal 13, which is arranged on the outermost first printed circuit layer 11; the second sub-section 2 further includes a fourth bonding terminal 23, which is arranged on the second printed circuit layer 21; the third bonding terminal 13 may be bonded and connected to the display panel; and the fourth bonding terminal 23 may be bonded and connected to the host side. The arrangement of the third bonding terminal 13 and the fourth bonding terminal 23 can enable the bonding circuit board to be bonded and connected to the display panel and the host side, respectively, so that the host side can input signals to and control the display panel.

In some embodiments, the first bonding terminal 14 and the third bonding terminal 13 are arranged in edge regions of two opposite ends of the first printed circuit layer 11, respectively; and the second bonding terminal 22 and the fourth bonding terminal 23 are arranged in edge regions of different ends of the second printed circuit layer 21, respectively. In accordance with the bonding and connection requirements, respective positions at which the first bonding terminal 14 and the third bonding terminal 13 are arranged on the first printed circuit layer 11 may be selected at will, and respective positions at which the second bonding terminal 22 and the fourth bonding terminal 23 are arranged on the second printed circuit layer 21 may be selected at will.

In some embodiments, the first sub-section 1 is of a regular shape, and the second sub-section 2 is of a regular or irregular shape. Since the first sub-section 1 is formed by stacking at least three first printed circuit layers 11, configuring the first sub-section 1 to a regular shape can increase the utilization rate of the circuit board having the staked structure of multiple first printed circuit layers 11, from which the first sub-section 1 is cut; and on the other hand, arranging the circuit elements 110 on the first sub-section 1 can improve the layout rate of the circuit elements 110 (number of circuit elements per unit area) while avoiding mutual inference of signals in the first signal wiring. The shape of the second sub-section 2 may be configured at will, so that the bonding circuit board can meet the requirement for it to be bonded to and accommodated in the display module in any shape, thereby increasing the utilization rate of the bonding circuit board.

Figure 6:
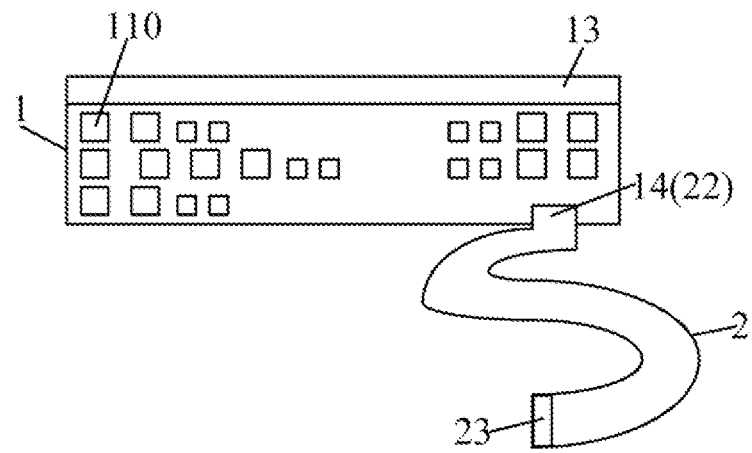
FIG. 6 illustrates a top view of a structure of another bonding circuit board according to some embodiments of the present disclosure.
Figure 7:
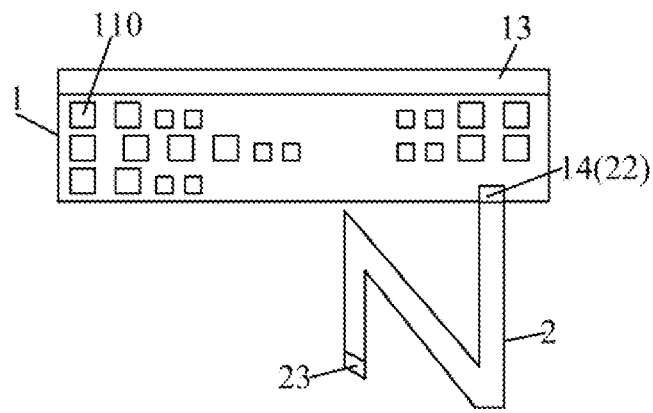
FIG. 7 illustrates a top view of a structure of yet another bonding circuit board according to some embodiments of the present disclosure.

In some embodiments, a shape of an orthographic projection of the first sub-section 1 includes a rectangle, and a shape of an orthographic projection of the second sub-section 2 includes an L shape. Alternatively, the shape of the orthographic projection of the second sub-section 2 may be an S shape, a Z shape or the like, as illustrated in FIGS. 6 and 7. To sum up, the second sub-section 2 may be cut into any shape in accordance with the appearance and shape of the display module to which the bonding circuit board is to be bonded and a size of a mounting space within the display module, so that the bonding circuit board can meet the requirement for it to be bonded to and accommodated in the display module in any shape.

In some embodiments, the insulation layer 12 is further arranged at an outer side of the first printed circuit layer 11 which is on a surface of the at least first printed circuit layers; and the insulation layer 12 is further arranged at an outer side of the second printed circuit layer 21. The insulation layer 12 can provide insulation protection to the first printed circuit layer 11 which is on the surface layer to prevent a short circuit or an open circuit from occurring in a circuit in the first printed circuit layer 11; and likewise, the insulation layer 12 can provide insulation protection to an exposed outer surface of the second printed circuit layer 21 to prevent the short circuit or the open circuit from occurring in a circuit in the second printed circuit layer 21.

In some embodiments, the insulation layer 12 is made of a polyimide or polyester material. The insulation layer 12 made of the above material has a certain degree of flexibility, making it easy to achieve the flexibility of the second sub-section 2, so that the second sub-section 2 can be moved freely and its position can be adjusted at will, which is beneficial for the bonding circuit board to meet the requirement for it to be bonded to and accommodated in the display module in any shape.

The pattern-making method for the bonding circuit board is a traditional one, which will not be repeated herein.

Figure 8:
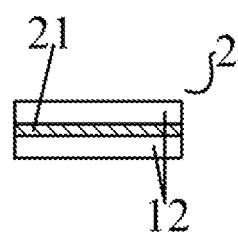
FIG. 8 illustrates a sectional view of a structure of a second sub-section of yet another bonding circuit board according to some embodiments of the present disclosure taken along line CC.

One embodiment of the present disclosure further provides a bonding circuit board. Unlike the foregoing embodiments, in the bonding circuit board, the second sub-section 2 includes one second printed circuit layer 21, the insulation layer 12 is arranged at each of two opposite sides of the second printed circuit layer 21, and the insulation layers 12 can provide insulation protection to the second printed circuit layer 21 to prevent the short circuit or the open circuit from occurring in the circuit in the second printed circuit layer 21, as illustrated in FIG. 8.

Other structures in the bonding circuit board in this embodiment are identical to those in the foregoing embodiments, and will not be repeated herein.

Since the bonding circuit board provided in the foregoing embodiments is configured to include the first sub-section formed by stacking at least three first printed circuit layers and the second sub-section composed of one or two second printed circuit layers, due to its relatively low material and manufacturing costs, the second sub-section composed of the one or two second printed circuit layers can be cut into any irregular shape to meet the requirement for the bonding circuit board to have an irregular shape, and due to its relatively high material and manufacturing costs, the first sub-section formed by stacking the at least three first printed circuit layers can be cut into a regular shape, thereby increasing the utilization rate of the circuit board having the stacked structure of multiple first printed circuit layers, from which the first sub-section is cut, and reducing the material and manufacturing costs of the bonding circuit board. Meanwhile, since the thickness of the second sub-section is small, the bonding circuit board, which is formed by bonding and connecting the first sub-section and the second sub-section, can be made flexible, so that the bonding circuit board can meet the requirement for it to be bonded to and accommodated in the display module in any shape, thereby increasing the utilization rate of the bonding circuit board.

Figure 9:
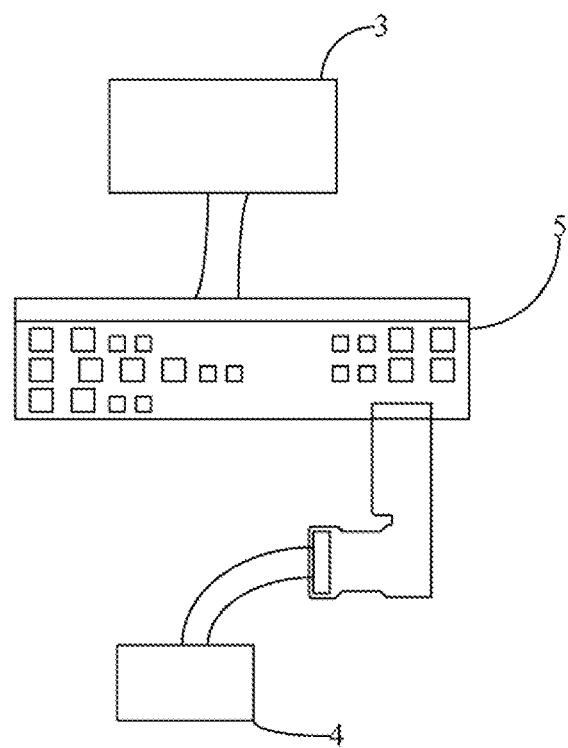
FIG. 9 illustrates a top view of a structure of a display apparatus according to some embodiments of the present disclosure.

In a second aspect, embodiments of the present disclosure provide a display apparatus. The display apparatus, as illustrated in FIG. 9, includes a display panel 3 and a host side 4, and further includes the bonding circuit board 5 according to any one of the foregoing embodiments; and the bonding circuit board 5 is bonded and connected to the display panel 3 and the host side 4, respectively.

By bonding and connecting the bonding circuit board 5 to the display panel 3 and the host side 4, respectively, the host side 4 can be enabled to input signals to and control the display panel 3, and also, the material and manufacturing costs of the display apparatus can be reduced.

In some embodiments, the display panel 3 includes a display substrate, and a control substrate, which is formed in the display substrate.

By adopting the bonding circuit board according to any one of the foregoing embodiments, the display apparatus not only can enable the host side to input signals to and control the display panel, but also requires less materials and manufacturing costs.

The display apparatus provided in embodiments of the present disclosure may be any product or component having a display function, such as an LCD panel, an LCD television, an OLED panel, an OLED television, an LED panel, an LED television, a monitor, a mobile phone, a navigator or the like.

In a third aspect, embodiments of the present disclosure provide an electrical appliance, including the display apparatus according to the foregoing embodiments.

By adopting the display apparatus according to the foregoing embodiment, the electrical appliance requires less material and manufacturing costs.

It is to be understood that the foregoing embodiments are merely exemplary embodiments for the purpose of illustrating the principle of the present disclosure. However, the present disclosure is not limited thereto. Various modifications and improvements can be made by a person skilled in the art without departing from the spirit and essence of the present disclosure. Accordingly, all of the modifications and improvements also fall into the protection scope of the present disclosure.

What is claimed is:

1. A bonding circuit board, comprising a first sub-section and a second sub-section, which are bondable and connectable to each other, one end of the first sub-section being connected to a display panel, and one end of the second sub-section being connected to a host side, the first sub-section comprises at least three first printed circuit layers, which are stacked on one another, a polyimide or polyester material is arranged between any two adjacent first printed circuit layers to form the first sub-section having a one-piece structure; and the second sub-section comprises one second printed circuit layer or two second printed circuit layers, which are stacked on each other, and the polyimide or polyester material being arranged between the two second printed circuit layers to form the second sub-section having a one-piece structure;

wherein the first printed circuit layers comprise circuit elements and first signal wiring, which are electrically connected to each other and constitute a peripheral circuit of the display panel and the host side;

wherein the one second printed circuit layer or two second printed circuit layers comprise second signal wiring, which is electrically connected to the first signal wiring;

wherein the first sub-section further comprises a first bonding terminal, which is arranged on an outermost first printed circuit layer of the at least three first printed circuit layers and is electrically connected to the first signal wiring; the second sub-section further comprises a second bonding terminal, which is arranged on the second printed circuit layer and is electrically connected to the second signal wiring; and the first bonding terminal and the second bonding terminal are connectable to each other by bonding;

wherein the first sub-section further comprises a third bonding terminal, which is arranged on the outermost first printed circuit layer; the second sub-section further comprises a fourth bonding terminal, which is arranged on the second printed circuit layer; the third bonding terminal is connectable to the display panel by bonding; and the fourth bonding terminal is connectable to the host side by bonding;

wherein the first bonding terminal and the third bonding terminal are arranged in edge regions of two opposite ends of the outermost first printed circuit layer, respectively; and the second bonding terminal and the fourth bonding terminal are arranged in edge regions of different ends of the second printed circuit layer, respectively; and wherein the bonding circuit board is bondable and connectable to the display panel only by the third bonding terminal, the bonding circuit board is bondable and connectable to the host terminal only by the fourth bonding terminal, and the first sub-section and the second sub-section are bondable and connectable to each other only by the first bonding terminal and the second bonding terminal.

2. The bonding circuit board according to claim 1, wherein the first signal wiring and the second signal wiring each comprises a power signal line, a data signal line and a control signal line.

3. The bonding circuit board according to claim 1, wherein the circuit elements are on an outermost first printed circuit layer of the at least three first printed circuit layers.

4. The bonding circuit board according to claim 3, wherein the circuit elements comprise a touch driver chip.

5. The bonding circuit board according to claim 1, wherein a shape of the first sub-section is a regular shape, and a shape of the second sub-section is a regular shape or an irregular shape.

6. The bonding circuit board according to claim 5, wherein a shape of an orthographic projection of the first sub-section comprises a rectangle, and a shape of an orthographic projection of the second sub-section comprises an L shape.

7. The bonding circuit board according to claim 1, wherein an insulation layer is further arranged at an outer side of a first printed circuit layer which is on a surface of the at least three first printed circuit layers; and an insulation layer is further arranged at an outer side of the second printed circuit layer.

8. A display apparatus, comprising a display panel and a host side, wherein the display apparatus further comprises the bonding circuit board according to claim 1, and the bonding circuit board is connected to the display panel and the host side by bonding, respectively.

9. The display apparatus according to claim 8, wherein the display panel comprises a display substrate, and a touch substrate, which is formed in the display substrate.

10. An electrical appliance, comprising the display apparatus according to claim 8.

11. An electrical appliance, comprising the display apparatus according to claim 9.

12. The display apparatus according to claim 8, wherein the first printed circuit layers comprise circuit elements and first signal wiring, which are electrically connected to each other and constitute a peripheral circuit of the display panel and the host side.

13. The display apparatus according to claim 12, wherein the second printed circuit layer comprises second signal wiring, which is electrically connected to the first signal wiring.

14. The display apparatus according to claim 13, wherein the first signal wiring and the second signal wiring each comprises a power signal line, a data signal line and a control signal line.

15. The display apparatus according to claim 12, wherein the circuit elements are on an outermost first printed circuit layer of the at least three first printed circuit layers.

* * * * *